United States Patent [19]

Ogisu et al.

[11] Patent Number: 5,441,626
[45] Date of Patent: Aug. 15, 1995

[54] PARTIALLY PLATED RESIN PRODUCTS AND PARTIAL PLATING PROCESS THEREFOR

[75] Inventors: Ysauhiko Ogisu; Mamoru Kato; Shigeyuki Takahashi; Toshiya Uemura; Toshikazu Funahashi, all of Aichi, Japan

[73] Assignee: Toyoda Gosei Co., Ltd., Nishikasugai, Japan

[21] Appl. No.: 225,066

[22] Filed: Apr. 8, 1994

[30] Foreign Application Priority Data

| Apr. 9, 1993 | [JP] | Japan | 5-083603 |
| Jul. 27, 1993 | [JP] | Japan | 5-185236 |
| Jul. 27, 1993 | [JP] | Japan | 5-185238 |
| Jul. 27, 1993 | [JP] | Japan | 5-185239 |
| Sep. 17, 1993 | [JP] | Japan | 5-231834 |
| Oct. 18, 1993 | [JP] | Japan | 5-260221 |
| Dec. 20, 1993 | [JP] | Japan | 5-320298 |

[51] Int. Cl.$^6$ ............................ C25D 5/02; C25D 7/00
[52] U.S. Cl. ................................... 205/50; 205/118; 205/122; 205/167; 205/223; 205/917; 293/115
[58] Field of Search ............... 205/118, 122, 137, 164, 205/165, 166, 167, 223, 917, 87, 50; 293/115; 180/68.6

[56] References Cited

FOREIGN PATENT DOCUMENTS

| 1588401 | 4/1970 | France . |
| 45-37843 | 12/1970 | Japan . |
| 52-50937 | 4/1977 | Japan . |
| 55-152195 | 11/1980 | Japan . |
| 5819467 | 2/1983 | Japan . |

Primary Examiner—John Niebling
Assistant Examiner—Edna Wong
Attorney, Agent, or Firm—Cushman, Darby & Cushman

[57] ABSTRACT

Annular grooves having substantially V-shaped cross sections are formed on the front surface and the rear surface of a grille body. A through hole communicating to the front surface and the rear surface of the grille body is also formed so that the front aperture may be smaller than the rear aperture. A protrusion is formed on the rear surface of the grille body, which is located inner than the groove. The grille body is immersed into a chemical plating solution to form a chemical plating layer on the entire surface of the grille body except for the bottoms of the grooves. The grille body is then subjected to undercoat plating, in which the grille body is immersed into a predetermined plating solution utilizing the protrusion as a kind of electrode so as to electrically charge the chemical plating layer present on the front surface from the layer present on the protrusion and through the layer present in the through hole to allow an undercoat plating layer to be formed on the portions where decorative plating is formed. The chemical plating layer formed on the portions where no decorative plating is formed is dissolved by a predetermined solution. A general electroplating layer is formed likewise on the undercoat plating layer. The chemical plating layer and the electroplating layer are formed only on the to-be-plated portions. The protrusion does not impair the front appearance of the front grille.

18 Claims, 12 Drawing Sheets

① : Undercoat plating step

② : Copper plating step

③ : Semi-brilliant nickel plating step

④ : Brilliant nickel plating step

⑤ : Chrome plating step

PARTIALLY PLATED RESIN PRODUCTS AND PARTIAL PLATING PROCESS THEREFOR

This application is based on Japanese Patent Application Nos. 5-185236, 5-320298, 5-185239, 5-260221, 5-185238, 5-231834 and 5-083603, all filed Apr. 9, 1993 the content of which is expressly incorporated herein by reference.

BACKGROUND OF THE INVENTION

1. Field of the Invention

The present invention relates generally to a partially plated resin product and a partial plating process there for, more particularly a resin product in which a decorative plating layer is formed only at the required portions on the surface of a resin base material.

2. Description of Related Art

It has generally been proposed to form front grilles of automobiles with resins and to decorate them using plating techniques.

Known techniques are shown for example, in Japanese Examined Patent Publication No. 45-37843 and Japanese Unexamined Patent Publication Nos. 55-152195 and 52-50937. In one of these techniques, as shown in FIG. 18, a contoured groove 72 having a substantially V-shaped cross section is defined on the surface of a base material 71 along the boundary between the to-be-plated or to-be-decorated portion (left side in FIG. 18) and the to-be-unplated portion (right side in FIG. 18). The base material 71 is first subjected to chemical plating to form a chemical plating layer 73 on the entire surface of the base material 71 except for the bottom 72a of the groove 72. Since the bottom 72a of the groove 72 is too narrow to allow a plating solution to intrude thereon, chemical plating cannot substantially be applied to the bottom 72a.

The base material 71 having the chemical plating layer 73 formed thereon is then subjected to an electroplating step, as shown in FIG. 19. The base material 71 is first immersed in a predetermined electroplating solution, and then the chemical plating layer 73 formed on the to-be-plated portion is electrically charged to allow an electroplating layer 74 to be formed thereon. The chemical plating layer 73 formed on the to-be-unplated portion is electrically insulated by the presence of the groove 72, so that the chemical plating layer 73 is dissolved by the electroplating solution and removed from the base material 71. Thus, the chemical plating layer 73 and the electroplating layer 74 can be formed on the base material 71 only at the portions where decorative plating is required.

The above-described technique can be applied when automotive exterior resin equipments such as front grilles and back panels are produced. For example, in the case of front grille, a plating layer is formed on the front surface of a front grille base material at predetermined portions, and a coating layer is formed on the rest of the portions (on the front surface).

In the conventional techniques described above, the plating layer including the chemical plating layer 73 and the electroplating layer 74 is occasionally formed on the front surface of the front grille in insular forms. In this case, the groove 72 is formed on the front surface of the base material 71 so as to form a contour line, and the to-be-plated portions must be electrically charged in the electroplating step. For such purpose, a protrusion serving as an electrode must be formed on the front surface of the base material 71 so as to secure charging. However, when the front grille finally obtained used, the protrusion remains on the front surface thereof which greatly impair the appearance of the product.

The protrusion can be removed after the electroplating step. However, since no plating layer is present at the portion from which the protrusion has been removed, the appearance of the product suffers.

SUMMARY OF THE INVENTION

Accordingly, it is a primary objective of the present invention to provide a resin product on which a plating layer is localized only on desired portions of the surface of a resin base material and a process therefor.

It is another objective of the present invention to provide a resin product and a partial plating process there for, in which the protrusion formed on the front grille does not impair the appearance of the product.

To achieve the foregoing and other objects and in accordance with the purpose of the present invention, there is provided a resin product partially having a decorative plating. The resin product comprises a resin base material having a front surface and a rear surface, provided with to-be-plated portions and to-be-unplated portions on the front surface; groove-like boundaries formed on the base material so as to demarcate the to-be-plated portions from the to-be-unplated portions, the boundaries forming predetermined contour lines; a decorative plating layer formed on the to-be-plated portions on the base material, the decorative plating layer having a chemical plating layer formed on the base material and an electroplating layer formed on the chemical plating layer; wherein the resin product contains a communicating section communicating the front surface of the base material with the rear surface thereof for electrically coupling the front and rear surfaces when the electroplating layer is formed and also a protrusion which protrudes from the rear surface of the base material and serves as a part of electrode when the electroplating layer is formed.

BRIEF DESCRIPTION OF THE DRAWINGS

The features of the present invention that are believed to be novel are set forth with particularity in the appended claims. The invention, together with the objects and advantages thereof, may best be understood by reference to the following description of the preferred embodiments taken in conjunction with the accompanying drawings.

FIGS. 1 to 12 show an automotive front grille according to a first embodiment of the invention; in which:

FIG. 1 shows a front view of the front grille;

FIG. 2 shows schematically, as a development, the front view and the rear view of the front grille clarifying the plated portions;

FIG. 3 shows a partially enlarged front view of a sub-partition of the front grille;

FIG. 4 shows a cross-sectional view taken along the line 4—4 of FIG. 3;

FIG. 5 shows a partially enlarged cross-sectional view of a mold for forming the grille main body;

FIG. 6 shows a partial cross-sectional view of the grille main body on which a chemical plating is applied;

FIG. 7 shows a partial cross-sectional view of the grille main body, in which the chemical plating possible to locate at the bottom of the groove is being cut off using a cutter;

FIG. 8 shows a partial cross-sectional view of the grille main body further having an undercoat plating layer formed on the chemical plating layer;

FIG. 9 shows a partial cross-sectional view of the grille main body, from which the chemical plating formed at a to-be-unplated portion is removed;

FIG. 10 shows a partial cross-sectional view of the grille main body having a general electroplating layer formed on the undercoat plating layer;

FIG. 11 shows a partial cross-sectional view of the grille main body, the plated portion of which is covered with an electroforming mask; and FIG. 12 shows a partial cross-sectional view of the grille main body on which a coating layer is formed on the unplated portions.

FIGS. 14 to 18 show an automotive back panel according to a second embodiment of the invention, in which:

FIG. 14 shows a front view of the back panel;

FIG. 15 shows a cross-sectional side view of the back panel main body;

FIG. 16 shows a partial perspective view of the back panel main body, mainly the ridge on which a chemical plating is applied;

FIG. 17 shows a cross-sectional view taken along the line 17—17 of FIG. 14; and

FIG. 18 shows a partial cross-sectional view of a base material on which a chemical plating is applied according to a conventional technique.

DETAILED DESCRIPTION OF THE PREFERRED EMBODIMENTS

A first embodiment of the present invention will be described below. The basic constitution of the resin product and that of the partial plating process there for according to the present invention are described in the first embodiment. In the second embodiment only the differences with the first embodiment are described.

First Embodiment

An automotive front grille 1 as the resin product according to a first embodiment of the present invention will be described referring to FIGS. 1 to 13.

Figure 1:
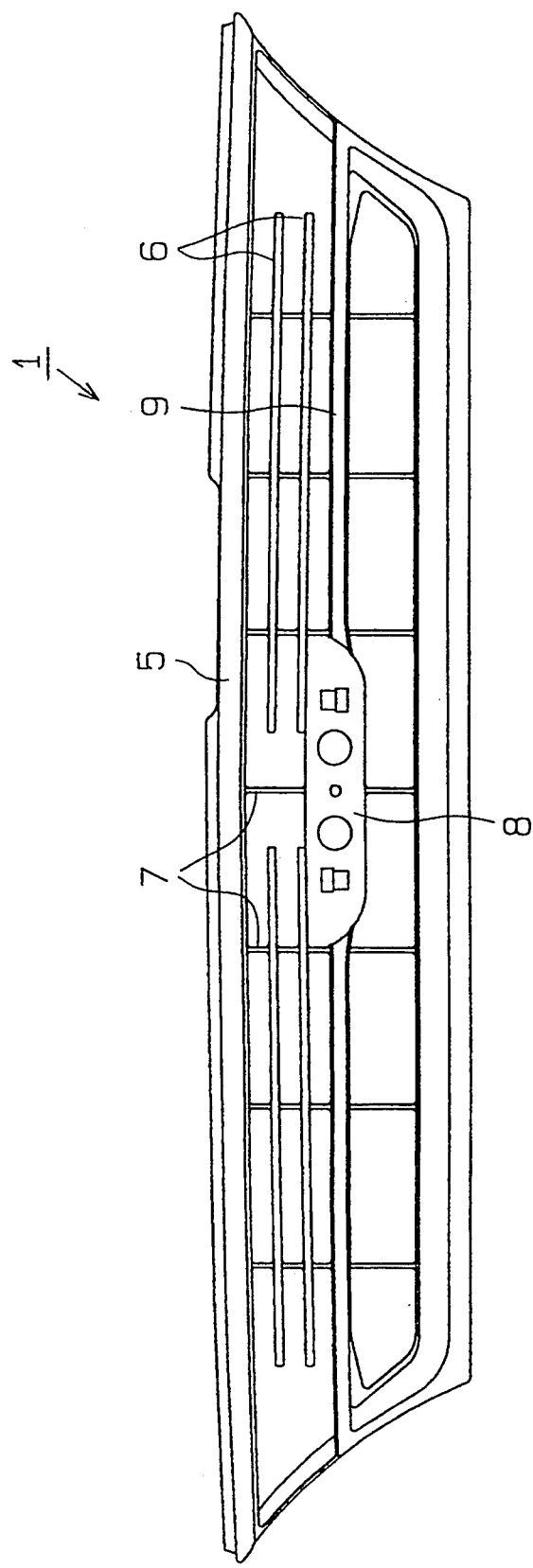
Figure 2:
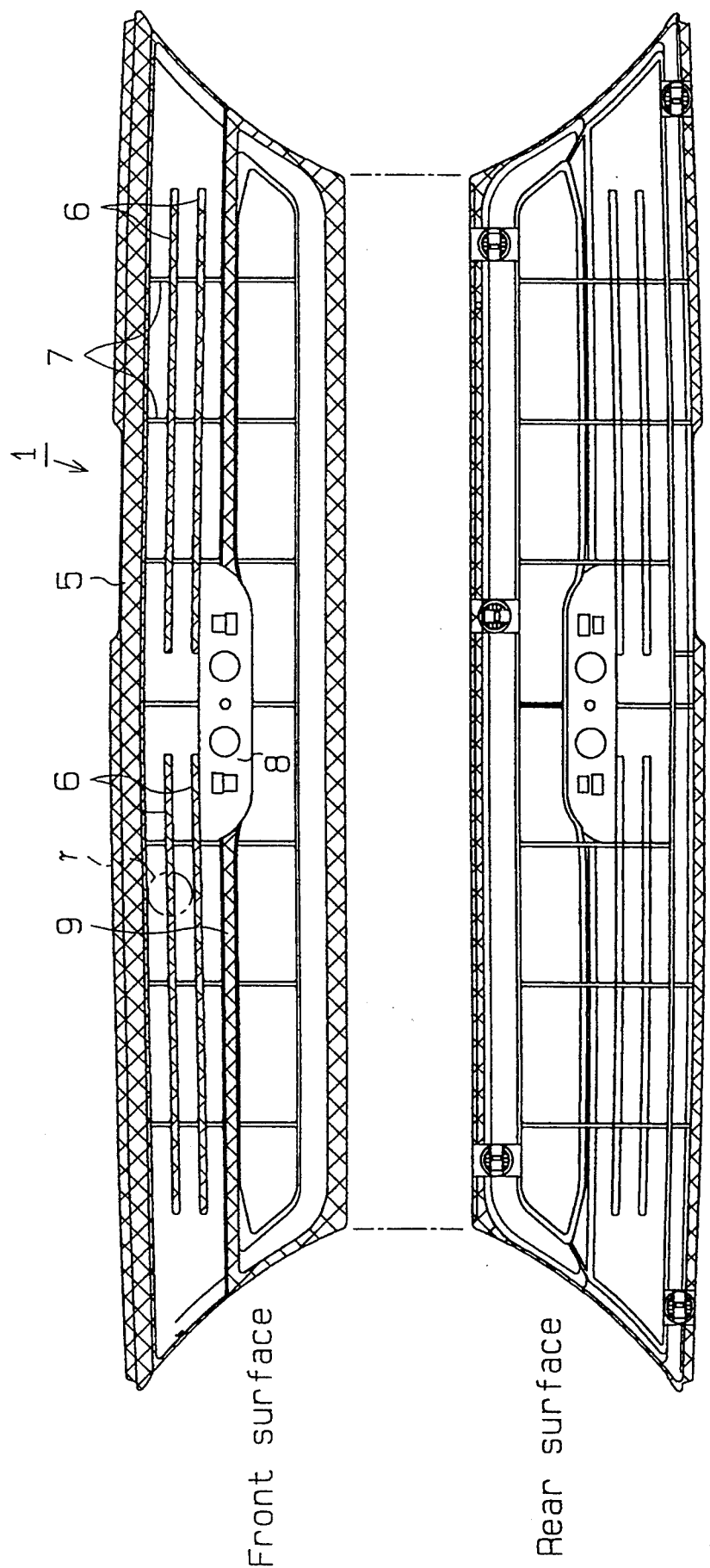
Figure 3:
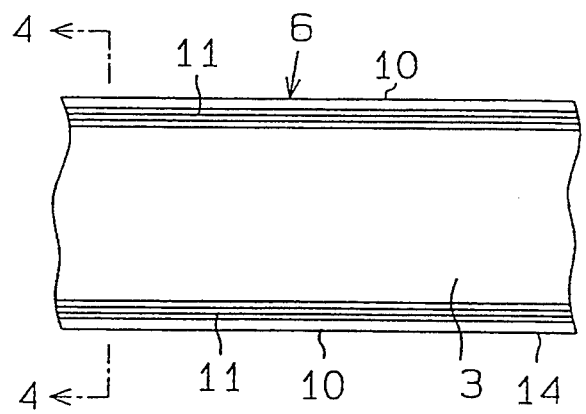

A front grille 1, as shown in FIG. 1, is attached to the front of an automobile. As shown in FIGS. 1 to 3, the front grille 1 is provided with a front grille main body (hereinafter referred to as grille body) 2 as an ABS (acrylonitrile-butadiene-styrene) resin base material. The front grille 1 has partly on the front surface a plating layer 3 (netting in FIG. 3) and a coating layer 4 formed on the rest of the portions except for some portions on the rear surface.

To describe more specifically, the front grille 1 has a substantially trapezoidal frame 5, in which a plurality of sub-partitions 6 extending horizontally are formed. A plurality of vertical connecting plates 7 are also formed in the frame 5. The front grille 1 has at the center thereof a fitting plate 8 for fitting thereon a mark plate (not shown), with a pair of main partitions 9 extending from the frame 5 toward the fitting plate 8. The plating layer 3 is formed mainly on the front surface of the frame 5 and also on the front surface of the main partitions 9. On the other hand, the coating layer 4 is formed mainly on the front surfaces of the sub-partitions 6, fitting plate 8 and connecting plates 7.

The description of the process for forming the plating layer 3 on the front surface of the frame 5 and on the front surface of the main partitions 9 is omitted. The partial plating process applied to the sub-partitions 6, where the plating layer 3 is formed in insular forms, will be described below in detail.

Figure 4:
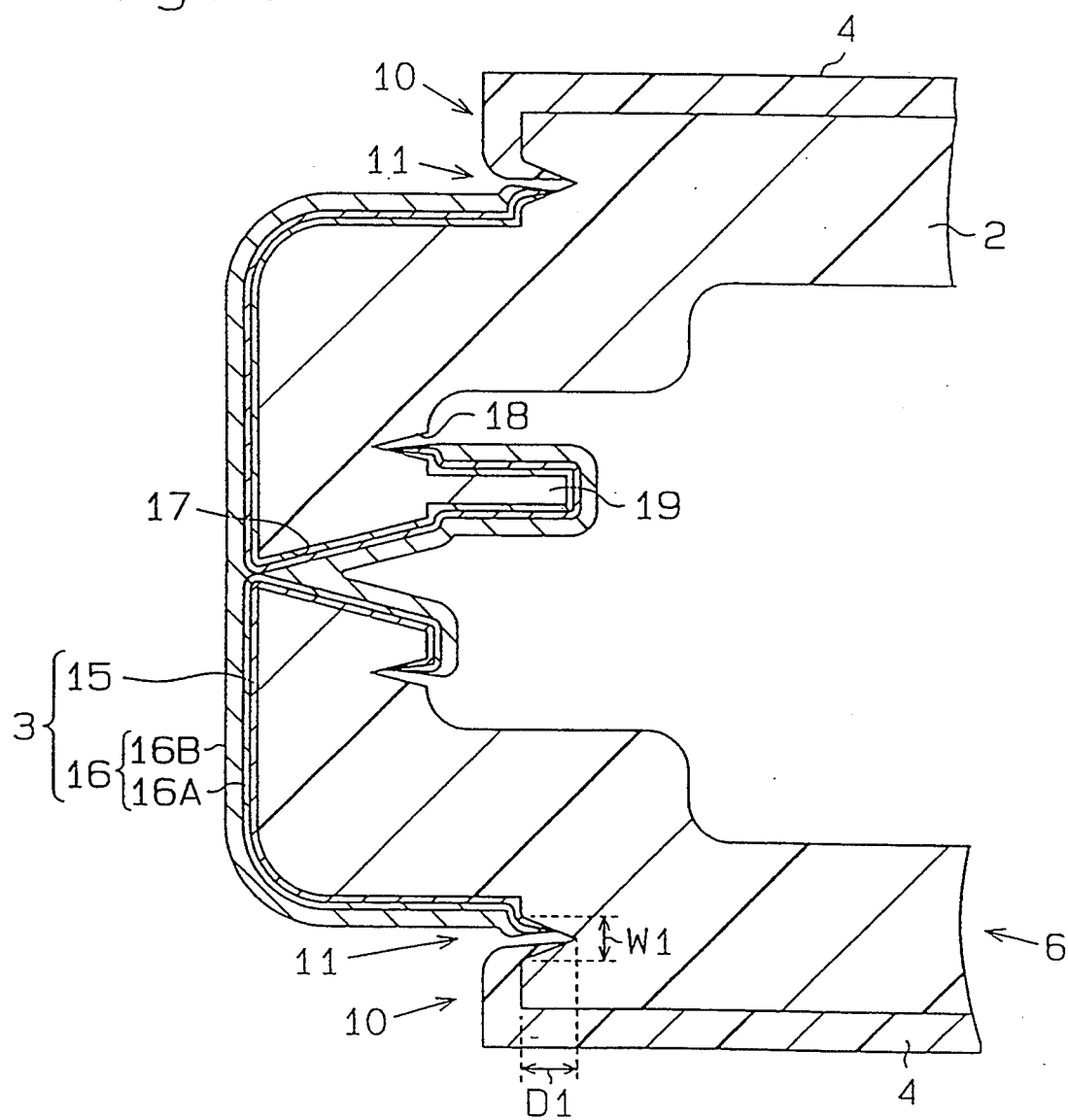

FIG. 3 shows a partially enlarged front view of a sub-partition of the front grille (the portion γ of FIG. 2). FIG. 4 shows a cross-sectional view taken along the line 4—4 of FIG. 3. As shown in FIGS. 3 and 4, a contoured step section 10 and a contoured groove 11 having a substantially V-shaped cross section are formed at the periphery of each sub-partition 6 so as to demarcate the boundary between the plating layer 3 and the coating layer 4. The sub-partition 6 also has a recess on the rear surface thereof.

As shown in FIG. 4, the plating layer 3 includes a chemical plating layer 15 and an electroplating layer 16. In this embodiment, a copper layer having a thickness of about 0.3 to 0.4 μm is formed as the chemical plating layer 15. The electroplating layer 16 has a thickness of about 20 to 50 μm and includes a nickel undercoat plating layer as a first electroplating layer 16A and a general electroplating layer 16B as a second electroplating layer. More specifically, the general electroplating layer 16B is a composite plating layer having a copper plating layer as the lowermost layer, a semi-brilliant nickel plating layer, a brilliant nickel plating layer and a chrome plating layer formed upward in this order. These layers are not shown.

The groove 11 formed on the grille body 2 has a width W1 of 0.5 mm and a depth D1 of 0.6 mm. While the width W1 may not particularly be limited, it is preferably not less than 0.3 mm due to the working limitations and not more than 1.0 mm so as to achieve improvement in design. While the depth D1 may not be so particularly limited, it is preferably not less than 0.3 mm likewise due to the working limitations. Further, the depth D1 to width W1 ratio (D1/W1) is preferably 1.0 or more. While the upper limit of ratio may not particularly limited, it is preferably 5.0 or less, more preferably 4.0 or less, in view of the ease in manufacturing. If the ratio is 3.0 or less, the manufacturing process is even more easily performed.

A through hole 17 having a substantially truncated-conical inner circumference is formed on the lower step section 10 of the sub-partition 6. In this through hole 17, the diameter of the front opening and that of the rear opening are adapted to be about 0.3 mm and about 3 mm, respectively, when the grille body 2 is molded.

A contoured groove 18 having a substantially V-shaped cross section, like the groove 11, is formed to surround the through hole 17 on the rear surface of the grille body 2 of the sub-partition 6. In addition, a protrusion 19 is integrally formed, on the rear surface, to protrude from the portion surrounded by the groove 18 at the vicinity of the through hole 17.

Figure 5:
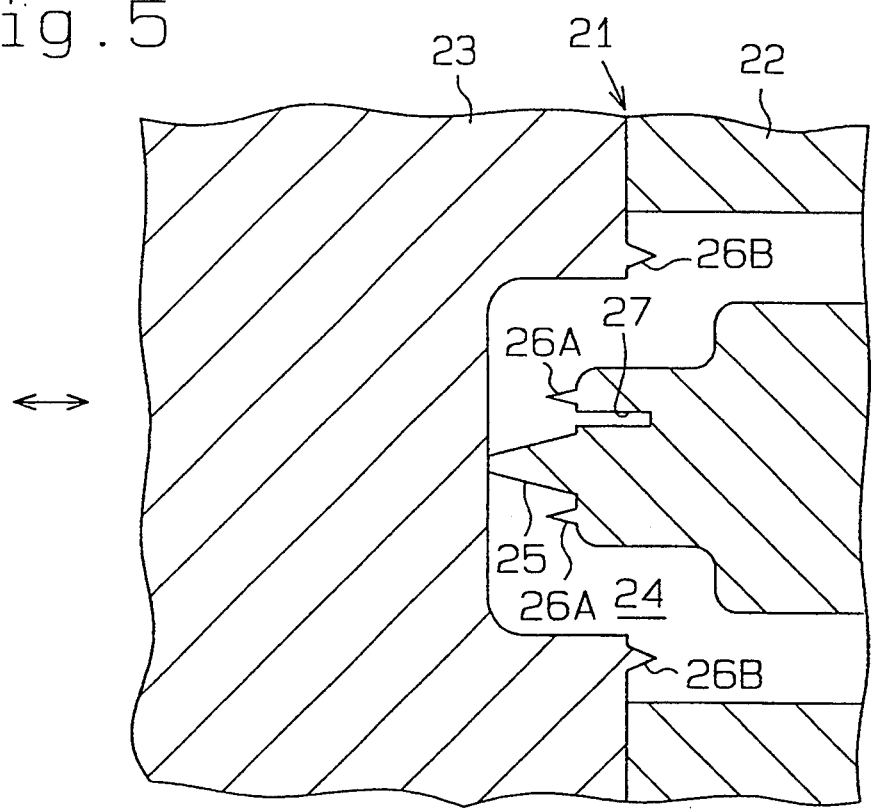

Next, the mold 21 for forming the grille body 2 will be described. As shown in FIG. 5, the mold 21 is provided with a fixed die 22 and a movable die 23. These two dies 22, 23 together define a cavity 24 for forming the grille body 2. It should be noted that a truncated-conical protrusion 25 and a ridge 26A, for forming the groove 18 are integral with the fixed die 22. A ridge 26B for forming the groove 11 is integral with the movable die 23. The fixed die 22 is further provided with a hole 27 for forming the protrusion 19.

Various plating solutions for forming the chemical plating layer 15 and the electroplating layer 16 will now be described. The plating solution for forming the chemical plating layer 15 contains 5 g/L of copper sulfate pentahydrate, 5 g/L of sodium hydroxide, 10 mL/L of formal in (37% by volume) and 25 g/L of a Rochelle salt. The plating solution for forming the undermost undercoat plating layer 16A in the electroplating layer 16 contains 250 g/L of nickel sulfate, 30 g/L of nickel chloride and 30 g/L of boric acid.

The plating solution for forming the copper plating layer in the general electroplating layer 16B contains 200 g/L of copper sulfate, 50 g/L of sulfuric acid, 0.01 g/L of hydrochloric acid and a trace of brightening agent. The plating solution for forming the semi-brilliant nickel plating layer contains 280 g/L of nickel sulfate, 45 g/L of nickel chloride, 40 g/L of boric acid and a trace of brightening agent. Further, the plating solution for forming the brilliant nickel plating layer contains 240 g/L of nickel sulfate, 45 g/L of nickel chloride, 30 g/L of boric acid, a trace of brightening agent and additives. The plating solution for forming the chrome plating layer contains 250 g/L of chromic anhydride, 10 g/L of sodium silicofluoride and 1 g/L of sulfuric acid.

A predetermined solution is prepared for dissolving the chemical plating layer 15 formed at the portions where no decorative plating is required at the step after the undercoat plating layer 16A. This solution is a 10% aqueous ammonia and has a liquid temperature of 50° C.

Figure 7:
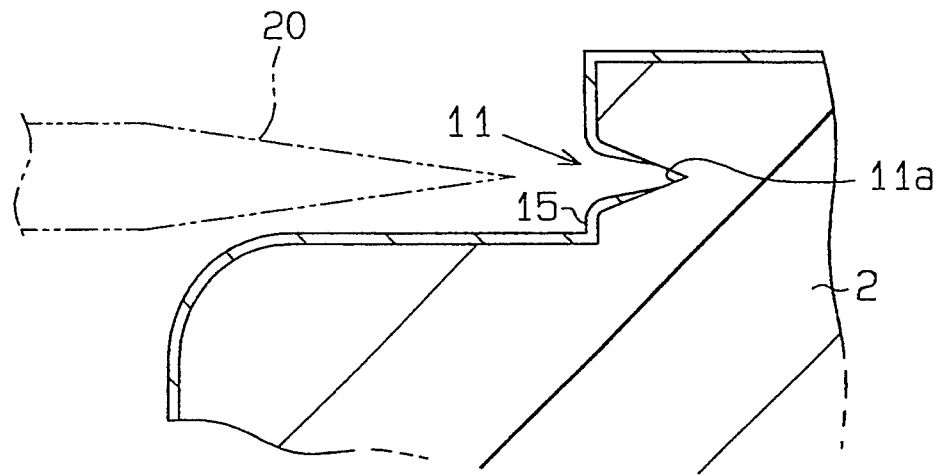

Further, an apparatus is provided for cutting off the chemical plating layer 15, which is likely to be formed at the bottoms 11a, 18a of the grooves 11, 18, prior to formation of the undercoat plating layer 16A. This apparatus is provided with a cutter 20, as shown in FIG. 7, and an actuator (not shown) for driving the cutter 20 and a controller (not shown) for controlling the operation of the actuator.

Next, the process for producing the front grille 1 will be described. It should be noted that partial plating process for the sub-partitions 6 will mainly be described, as mentioned above.

An ABS resin melt is first injected to fill the cavity 24 according to a known molding method (see FIG. 5). After the resin is cooled and solidified, the dies 22, 23 are opened to remove the grille body 2. In this process, the dies 22, 23 are opened in a direction such that the protrusion 25 and the ridges 26A, 26B can be withdrawn from the grille body 2, so that the protrusion 25 and the ridges 26A, 26B do not interfere with the mold opening to allow smooth releasing of the grille body 2. Thus, the grille body 2 having the contoured grooves 11, 18 and the through hole 17 at predetermined sites can be obtained.

Figure 6:
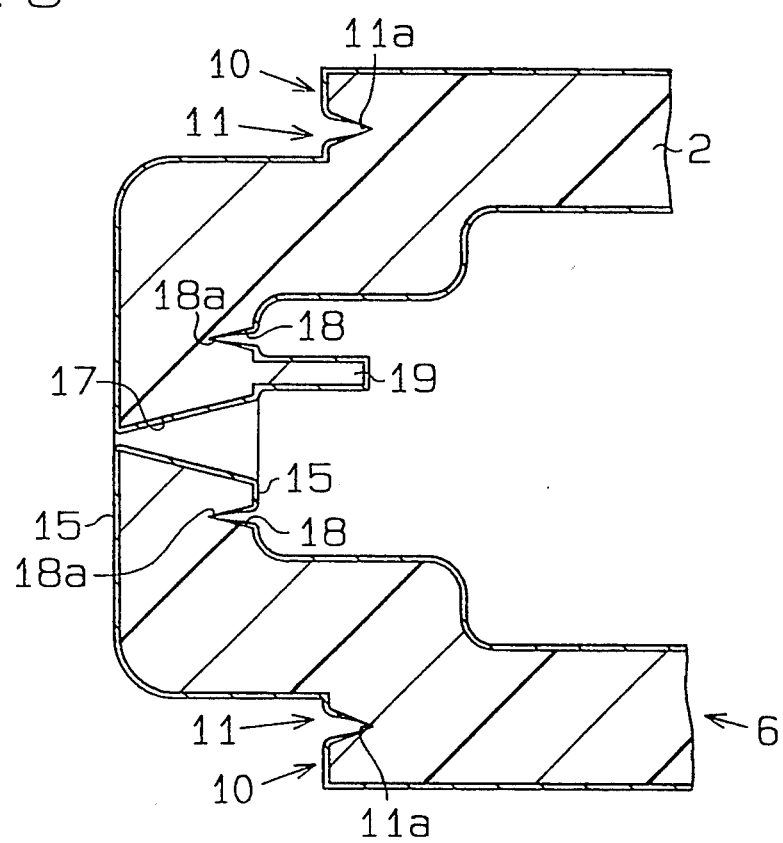

Subsequently, a pretreatment is performed to the grille body 2. The pretreatment includes etching the surface of grill body to increase the surface area of grille body and adhering palladium catalyst to the etched surface to improve the bonding characteristics with a plating layer. The thus obtained grille body 2 is immersed into a chemical plating solution to apply chemical plating. Since the bottoms 11a, 18a of the grooves 11, 18 are too narrow, as shown in FIG. 6, to allow the plating solution to intrude thereto. Accordingly, chemical plating is not substantially applied to these bottoms 11a, 18a, and the chemical plating layer 15 can be formed on the entire surface of the grille body 2 except for the bottoms 11a, 18a.

The grille body 2 is then subjected to a chemical plating cutting step. The cutter 20 is slid along the bottoms 11a, 18a of the groove 11, 18, as shown in FIG. 7. By this sliding motion, the chemical plating layer 15 at the bottoms 11a, 18a is entirely cut off. Thus, the electrical continuity between the chemical plating layers 15 on both sides of the grooves 11, 18 is severed. Accordingly, the plating layer 3 is prevented from being formed at the bottoms 11a, 18a of the grooves 11, 18 in the subsequent electroplating step. The presence of electrical continuity can easily be detected by employing a continuity test.

Figure 8:
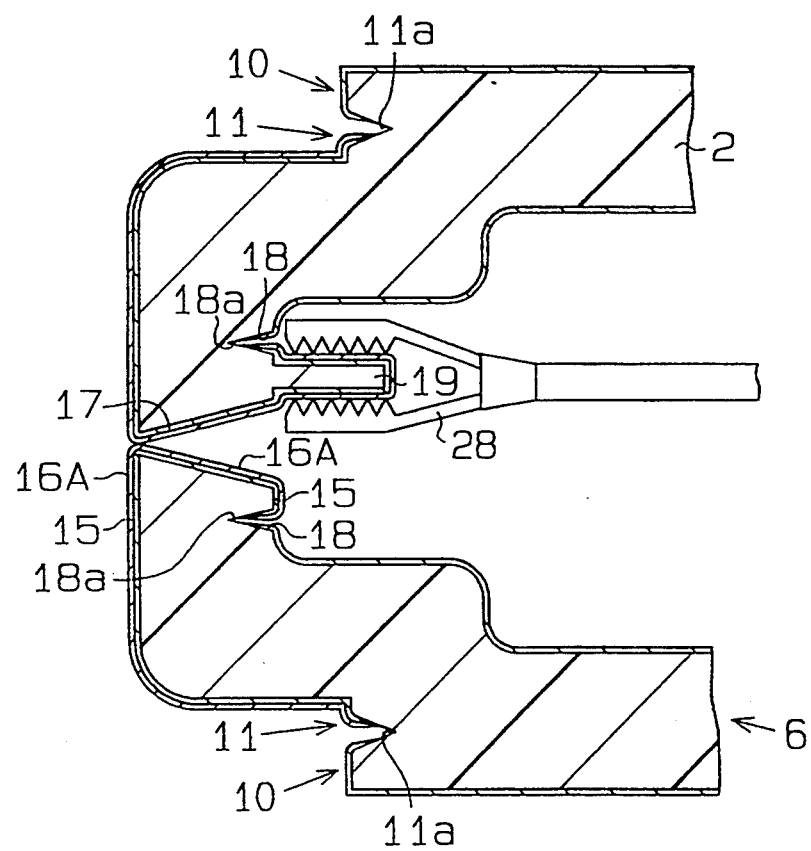

Next, in the undercoat plating step as the first electroplating step, the grille body 2 having the chemical plating layer 15 formed thereon is immersed into a plating solution for forming the undercoat plating layer 16A for a predetermined time. The to-be-plated (to-be-decorated) portions are electrically charged utilizing the protrusion 19 formed on the rear surface of the grille body 2 as an electrode. The protrusion 19 having the chemical plating layer 15 formed thereon is pinched with a clip 28, to which electrical current is then applied. Thus, as shown in FIG. 8, no plating layer is formed on the to-be-unplated portions, since these portions are electrically insulated by the grooves 11, 18. On the other hand, a relatively thin undercoat plating layer 16A is formed on the to-be-plated portions having the chemical plating layer 15 formed thereon.

Figure 9:
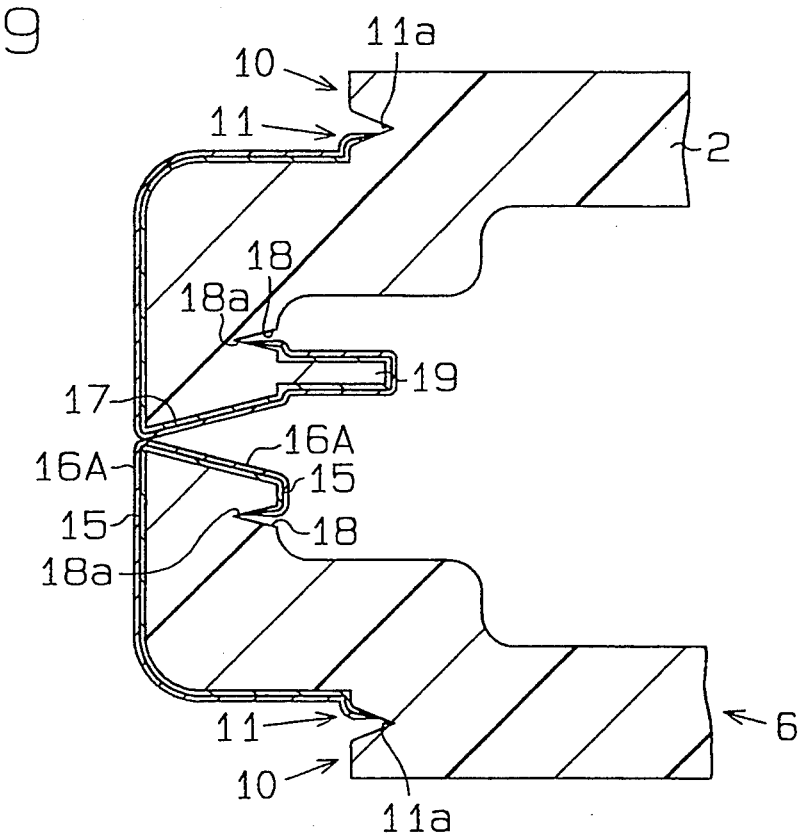

In the subsequent step of dissolving the chemical plating layer, the grille body 2 having the undercoat plating layer 16A formed thereon is immersed into a predetermined solution for about 5 minutes. In this step, the portions on which the undercoat plating layer 16A is formed are not dissolved by an alkaline aqueous ammonia solution, since the layer 16 is made of nickel. Since copper is used for the chemical plating layer 15 formed on the to-be-unplated portions, the layer 15 is dissolved by the alkaline aqueous ammonia solution. Thus, as shown in FIG. 9, the chemical plating layer 15 formed on the to-be-plated portions and the undercoat plating layer 16A formed thereon remain on the surface of the grille body 2. The chemical plating layer 15 is not present at the other portions than the portions where the undercoat plating layer 16A is formed. Accordingly, no plating layer except for the undercoat plating layer 16A is exposed on the grille body 2.

Subsequently, in the second electroplating step including the copper plating step, semi-brilliant nickel plating step, brilliant nickel plating step and chrome plating step, the procedures in the first electroplating step are repeated substantially analogously. It should be noted that the chemical plating layer 15 formed on the to-be-unplated portions has already been dissolved in a predetermined solution and is no longer present on the grille body 2. Accordingly, certain advantages result e.g. contamination of subsequent steps by the metal of this layer is avoided. Further, the formation of any plating layer 3 on the to-be-unplated portions or short-circuiting between the grooves 11, 18 is prevented.

Figure 10:
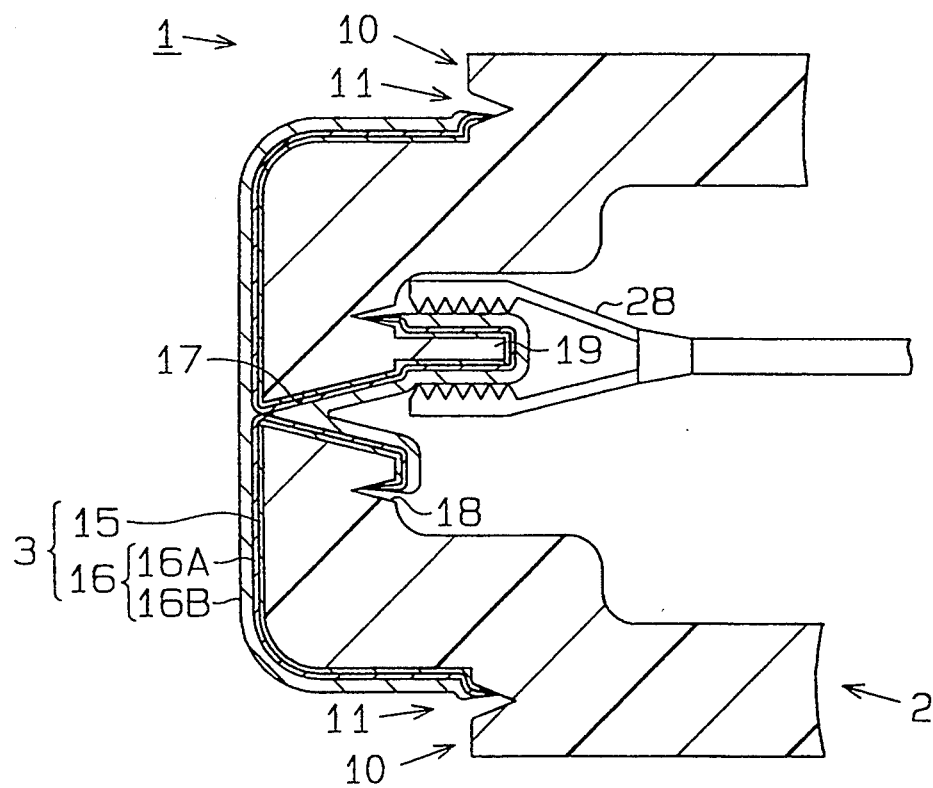

As shown in FIG. 10, a multi-layered general electroplating layer 16B can be formed on the undercoat plating layer 16A by application of the second electroplating step including the steps as described above. Thus, the plating layer 3 consisting of the chemical plating layer 15, the undercoat plating layer 16A and the general electroplating layer 16B is formed on the to-be-plated portions only.

Figure 11:
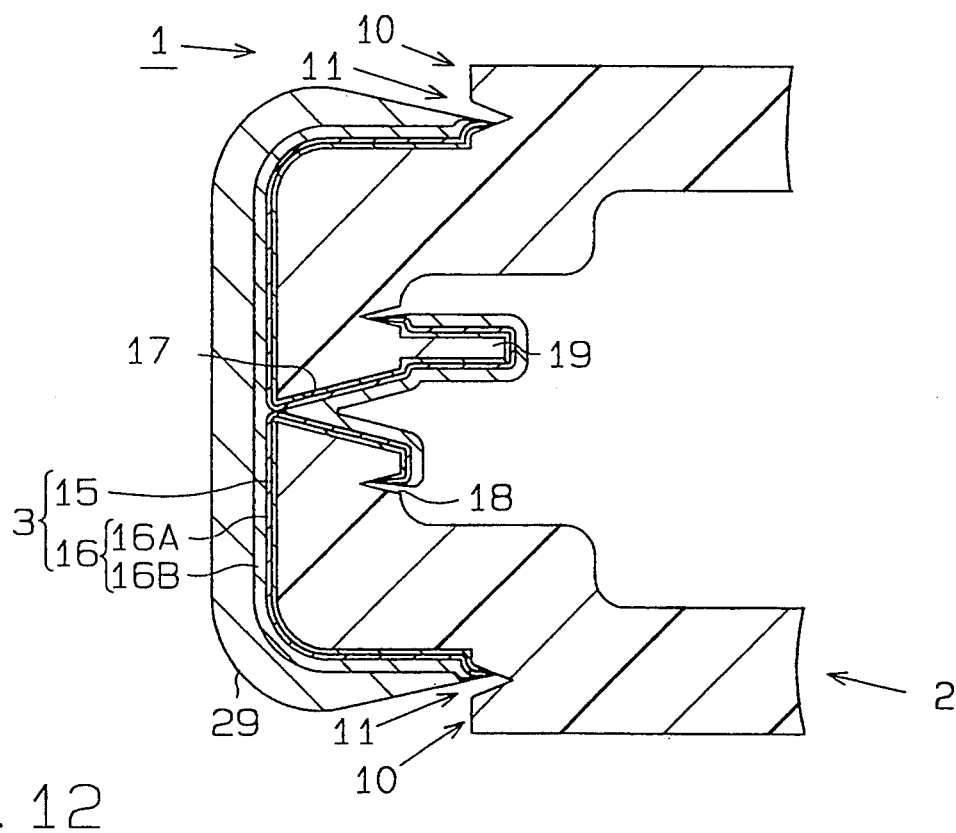
Figure 12:
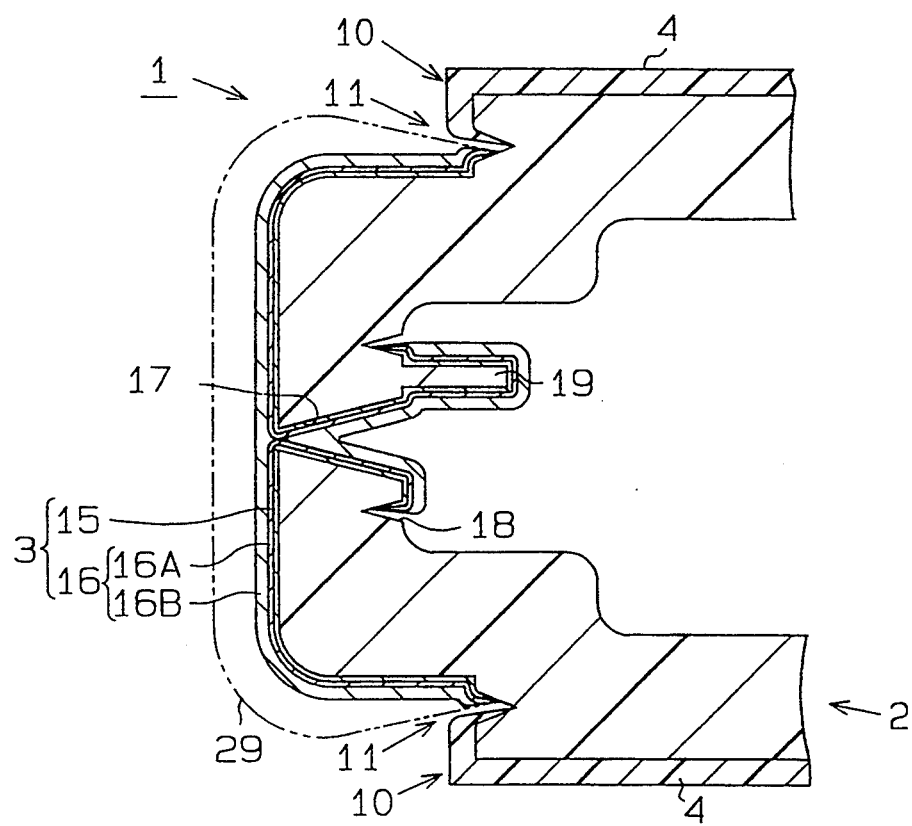

Subsequently, the portions on which the plating layer 3 is formed are covered with the electroforming mask 29, as shown in FIG. 11. The electroforming mask 29 is made of a metal plate having a thickness of several millimeters and a profile conforming to that of the front grille 1. Openings, which open at the portions where the coating layer 4 is formed, are suitably defined in the electroforming mask 29. When the electroforming mask 29 is applied to the grille body 2, the portions where coating layer 4 is formed are exposed through these openings. Then, as shown in FIG. 9, the exposed portions are subjected to spray coating to form the coating layer 4 on the to-be-coated portions. On the other hand, no coating layer 4 is formed at the portions covered with the electroforming mask 29.

The electroforming mask 29 is then removed from the grille body 2 to obtain the front grille 1 shown in FIG. 4. The front grille 1 has the plating layer 3 substantially on the front surface of the sub-partitions 6 and the coating layer 4 at the periphery thereof.

As described above, no chemical plating layer 15 is formed at the bottoms 11a, 18a of the grooves 11, 18 according to this embodiment, so that only the portions where decorative plating layer should be formed are electrically charged when the electroplating layer 16 is formed. Accordingly, the chemical plating layer 15 formed on the to-be-unplated portions is dissolved by a predetermined solution. On the to-be-plated portions, the multi-layered electroplating layer 16 is formed on the surface of the chemical plating layer 15. Thus, the grille body 2 having the plating layer 3 formed securely on the to-be-plated portions only can be obtained in this stage. On the other hand, when the coating layer 4 is formed on the plating layer formed on the entire surface of the grille body in the prior art process, a primer must preliminarily be applied to the to-be-coated portions of the plating layer 3. However, this embodiment requires no such primer, and the coating layer 4 can be formed directly on the grille body 2. As the result, the number of working steps and the cost can be reduced.

Moreover, the electroplating layer 16 need not be formed on the entire surface of the grille body 2, also contributing to the cost reduction.

Neither the plating layer 3 nor the primer layer is interposed at the portions where the coating layer 4 is formed directly on the grille body 2, so that the coating layer 4 can be applied thin, leading to excellent appearance of the resulting product. Further, since the coating layer 4 and the grille body 2 are both made of resin materials, the coating layer 4 can firmly be adhered onto the grille body 2. Accordingly, the coating layer will not flake, and the durability of the coated portions can be improved.

In this embodiment, the step section 10 on the front surface, more precisely the groove 11, demarcates the boundary between the coating layer 4 and the plating layer 3. Accordingly, the parting line at the boundary does not define a zigzag form but is clearly defined. Thus, the parting line is definite, and the appearance of the resulting product is improved.

The chemical plating layer 15 formed on the protrusion 19 on the rear surface of the grille body 2 is electrically charged in carrying out the electroplating step. Thus, the chemical plating layer 15 on the protrusion 19 is electrically coupled to the chemical plating layer 15 on the front surface via the chemical plating layer 15 at the through hole 17. Accordingly, the chemical plating layer 15 can electrically be charged from the rear surface, even though no protrusion is formed on the front surface. This permits decorative electroplating layer 16 to be formed on the chemical plating layer 15 on the to-be-plated portions. Deterioration of the appearance of the resulting product due to the presence of protrusion is eliminated which improves overall esthetics.

The aperture of the through hole 17 opening to the front surface is designed to be smaller than the aperture thereof opening to the rear surface. By making the aperture on the front surface as small as possible, the chemical plating layer 15 can be formed in the front opening of the through hole 17. As a result, the presence of the through hole 17 cannot be recognized after formation of the plating layer 15. If the aperture of the through hole 17 on the designed surface is fully minimized, this results in additional improvements in appearance.

This embodiment employs a constitution in which the through hole 17 is formed in the grille body 2, and the groove 18 is formed on the rear surface. Accordingly, the plating layer 3 formed on the rear surface may only be present on the portion surrounded by the groove 18, so that the total amount of the plating solution can be reduced, leading to cost reduction.

When the chemical plating layer 15 is formed, generally no chemical plating layer 15 should form at the bottoms 11a, 18a of the grooves 11, 18. If the chemical plating layer 15 should form at the bottoms 11a, 18a, the chemical plating layer 15 is eve off along the grooves 11, 18 using the cutting device provided with the cutter 20. This results in the electrical continuity of the chemical plating layer 15 on each side of the grooves 11, 18 being severed. Accordingly, the to-be-plated portions are prevented from being electrically connected with the to-be-unplated portions. These two portions are thereby securely insulated. Thus, formation of the plating layer 3 on the to-be-unplated portions is prevented.

Moreover, when the chemical plating layer 15 is cut off, the cutter 20 merely slides along the grooves 11, 18, easily cutting off the chemical plating layer 15.

In the above embodiment, the undercoat plating layer 16A is made of copper. However, the undercoat plating layer 16A can be made of nickel. In this case, the chemical plating layer 15 can be dissolved simultaneously with the formation of the undercoat plating layer 16A in the undercoating plating step. This avoids the no need for the extra step for dissolving the chemical plating layer 15.

The process for producing the front grille 1 according to this embodiment will be described below briefly.

A plating solution for forming the undercoat plating layer is first prepared. This solution has a liquid temperature of 55° C. and contains 250 g/L of nickel sulfate, 170 g/L of nickel chloride, 4 g/L of hydrochloric acid and 40 g/L of boric acid. The hydrogen ion exponent (hereinafter referred to as pH) of the thus prepared solution is 1.5. The plating solution preferably has the pH of not higher than 4.

The chemical plating layer 15 is then formed on the entire surface of the grille body 2 except for the bottoms 11a, 18a. The grille body 2 having the chemical plating layer 15 formed thereon is then subjected to the electroplating step including the undercoat plating step, copper plating step, semi-brilliant nickel plating step, brilliant nickel plating step and chrome plating step. First, in the undercoat plating step, the grille body 2 having the chemical plating layer 15 formed thereon is immersed in an undercoat plating solution for a predetermined time. The to-be-plated portions are electrically charged. Then, the chemical plating layer 15 formed on the to-be-unplated portions is dissolved by the undercoat plating solution, because the solution has a high acidity (PH=1.5) sufficient to dissolve readily the chemical plating layer on the uncharged portions. On the other hand, a relatively thin undercoat plating layer 16A is formed on the surface of the chemical plating layer 15 on the to-be-plated portions.

In the subsequent copper plating step, semi-brilliant nickel plating step, brilliant nickel plating step and chrome plating step, the above procedures are repeated analogously. It should be noted that the chemical plating layer 15 formed on the to-be-unplated portions has already been dissolved in the plating solution for forming the undercoat plating layer 16A, while the undercoat plating layer 16A is formed on the surface of the chemical plating layer 15 present on the to-be-plated portions. Accordingly, the chemical plating layer 15 is not exposed in the respective steps after the copper plating step, so that the chemical plating layer 15 is dissolved in the plating solutions of the respective steps after the copper plating step to prevent contamination of these plating solutions.

Figure 13:
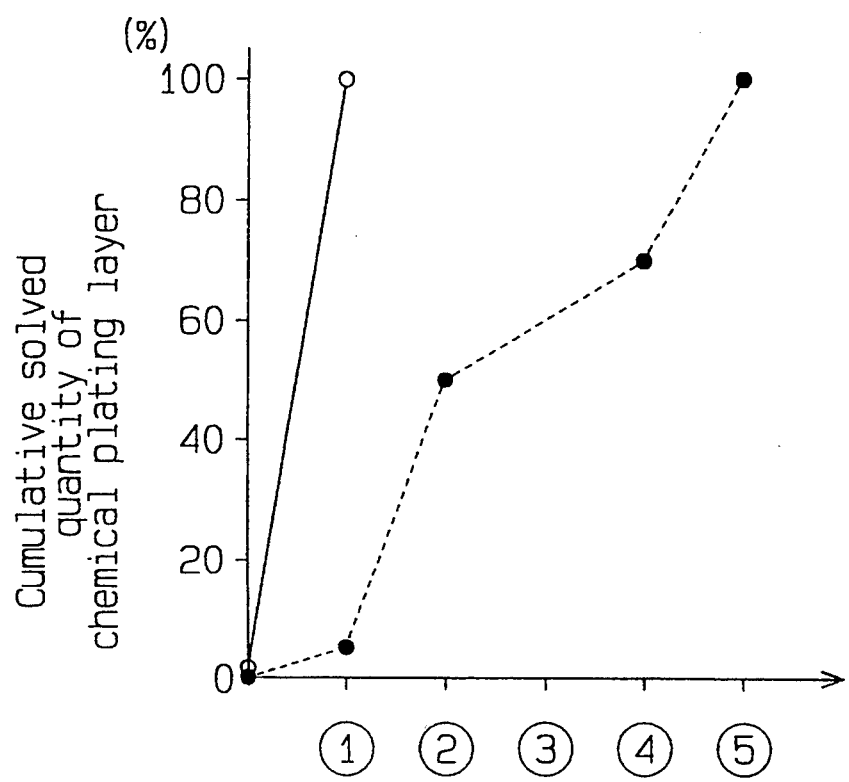
FIG. 13 shows a plot of cumulative solved quantity of chemical plating layer in the respective steps in the electroplating step, in a modified embodiment of the present invention.

FIG. 13 shows a plot of cumulative solved quantity of the chemical plating layer 15 in the plating solutions of the respective steps in the electroplating step according to the present embodiment (solid line) and to a comparative embodiment (broken line). In the comparative embodiment, the step of dissolving the chemical plating layer 15 is not included in the chemical plating step. As shown in FIG. 13, the chemical plating layer dissolves gradually in the plating solutions of the respective plating steps in the comparative embodiment. In contrast, in the present embodiment, the chemical plating layer 15 is dissolved entirely in the plating solution of the undercoat plating step, so that no dissolution of the chemical plating layer 15 occurs thereafter. Accordingly, contamination of the respective plating solutions is prevented. Thus, the plating solution employed in one plating step need not be replaced. This results in cost reductions. Further, no extra solution for dissolving the chemical plating layer, as described above, need not be used.

Second Embodiment

An automotive back panel 51 as the resin product according to a second embodiment of the present invention will be described referring to FIGS. 14 to 17. It should be noted that the major part of the present embodiment is substantially the same as in the first embodiment, so that the differences will mainly be described.

Figure 14:
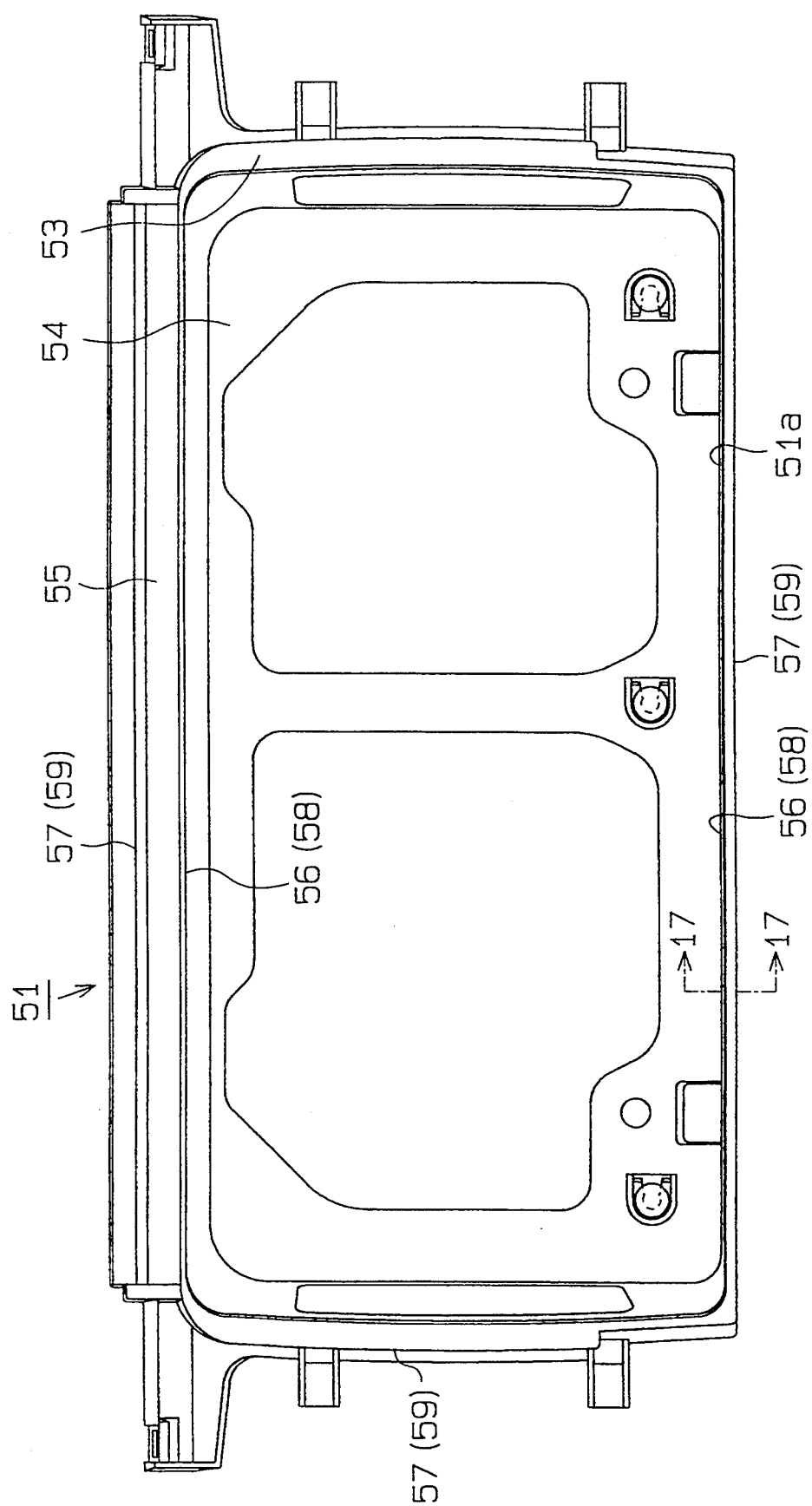

As shown in FIG. 14, a back panel 51 is fitted to the rear of an automobile where a number plate is attached.

The back panel 51 is formed to have a substantially box-like shape having an opening 51a. The back panel 51 is provided with a back panel body 52 made of an ABS resin (see FIG. 15). The back panel 51 further has a plating layer 53 formed partially in a substantially rectangular form on the front surface at the periphery and a coating layer 54 formed on the rest of the portion inner than the plating layer 53 except for the rear surface. A transparent red horizontal decorative member 55 is fitted to the upper portion of the back panel body 52.

Figure 15:
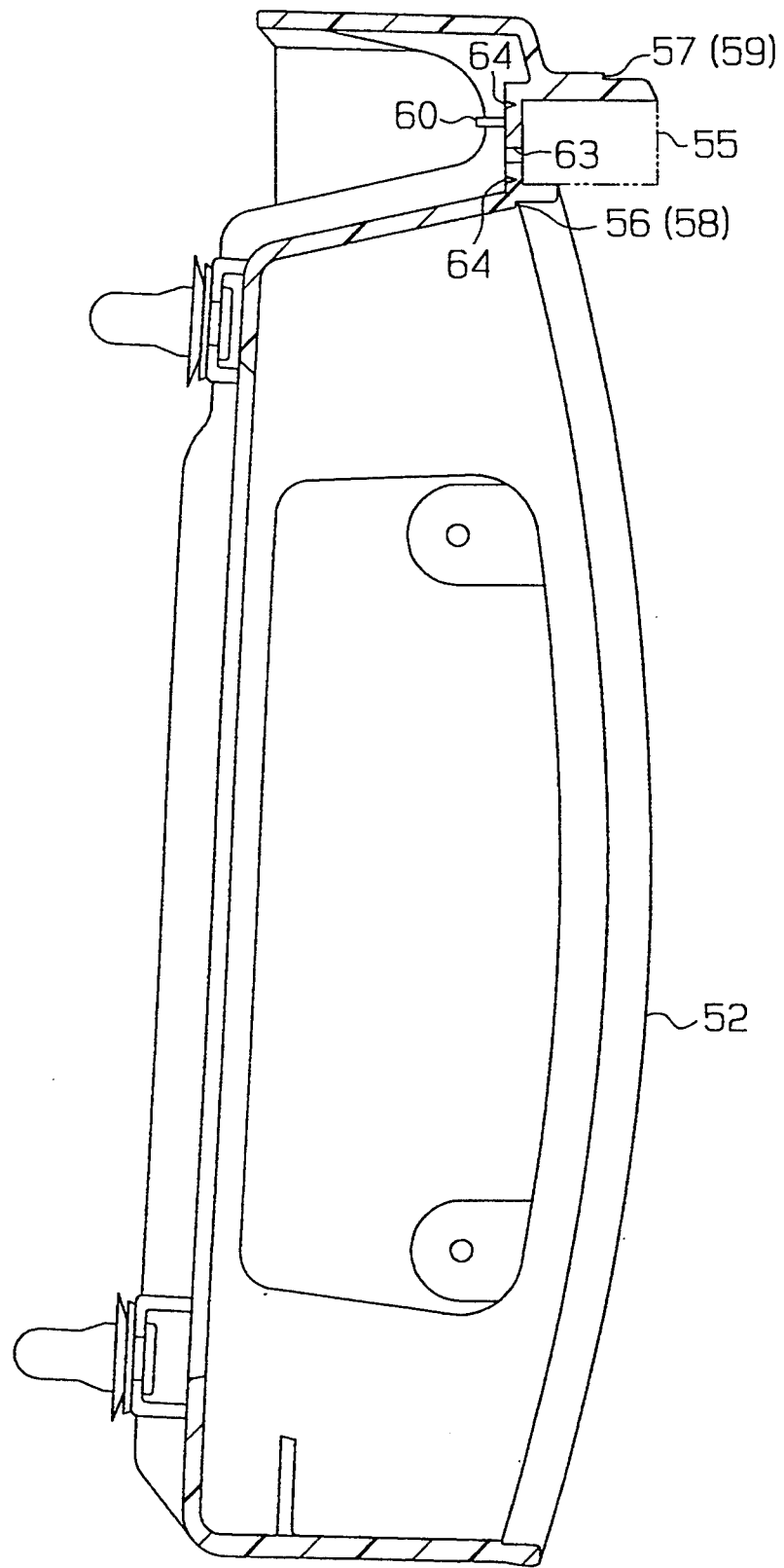
Figure 16:
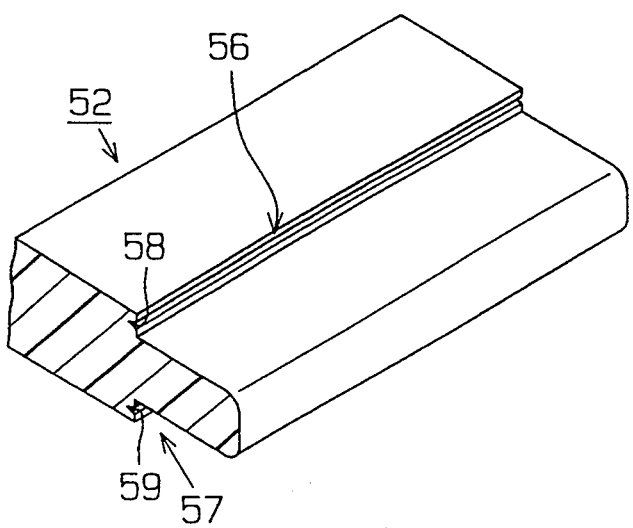
Figure 17:
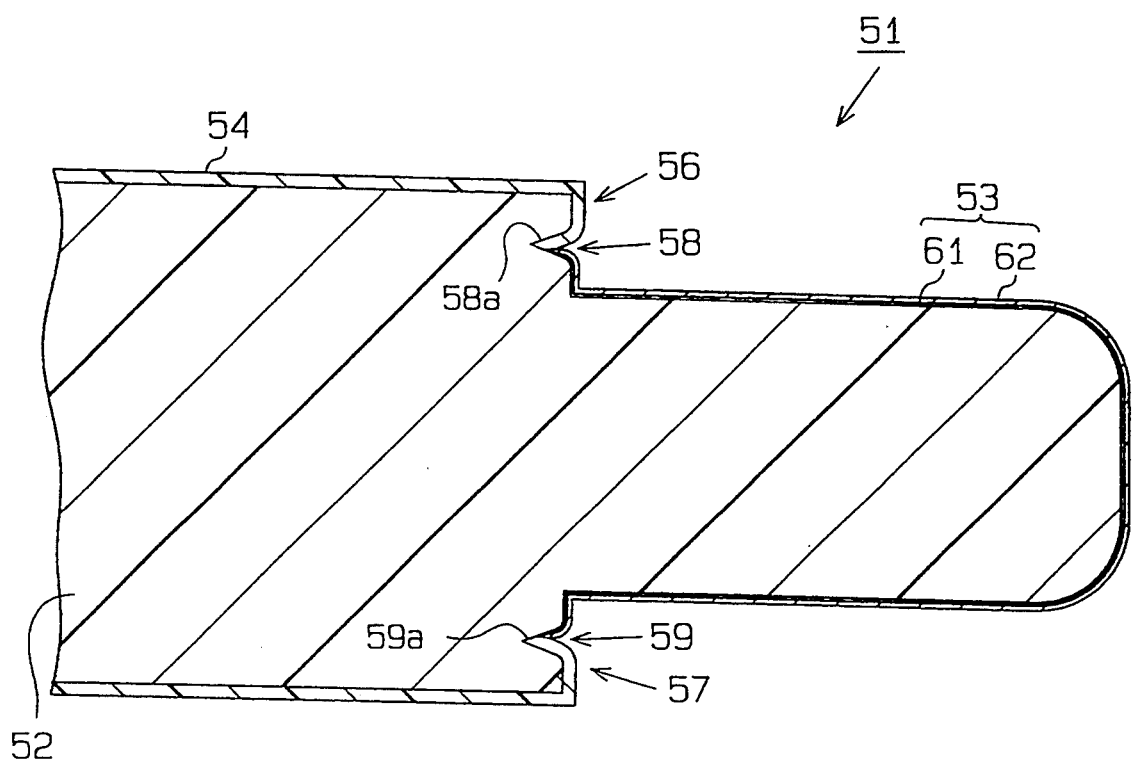
Figure 18:
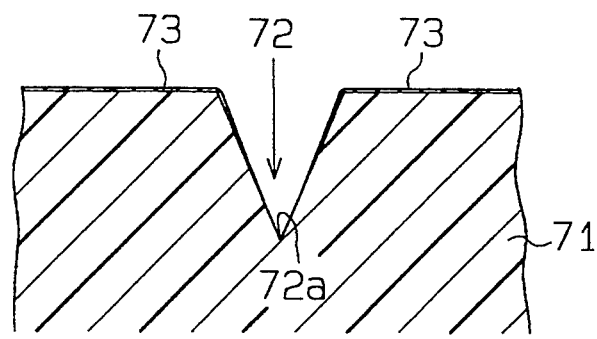
Figure 19:
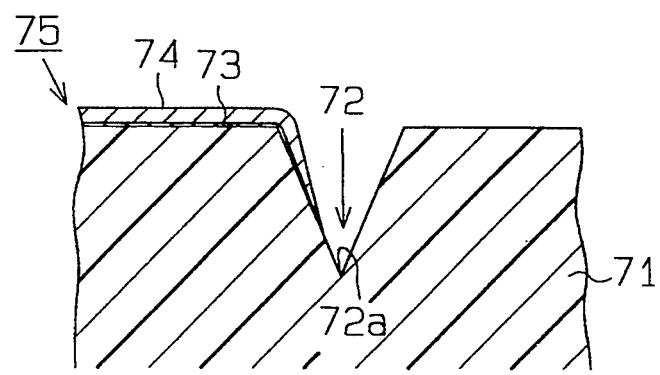
FIG. 19 shows a partial cross-sectional view of the base material having an electroplating further applied on the chemical plating according to the conventional technique.

As shown in FIGS. 16 and 17, a contoured inner step section 56 and a contoured outer step section 57 are formed along the periphery of the back panel body 52 so as to demarcate the boundary between the plating layer 53 and the coating layer 54. Contoured grooves 58, 59 having substantially V-shaped cross sections are formed along these step sections 56, 57. A through hole 63 is formed at the portion to be covered with the decorative member 55, as shown in FIG. 15. A protrusion 60 serving as an electrode protrude backward from the rear surface of the portion which is covered with the decorative member 55. In addition, a contoured groove 64 is formed to surround the through hole 63 and the protrusion 60 on the rear surface of the portion to be covered with the decorative member 55. This groove intercepts the electrical continuity from the protrusion 60 formed inner than the groove 64 to the outer portion.

Moreover, the plating layer 53 has a chemical plating layer 61 and an electroplating layer 62 formed thereon. The composition of the chemical plating layer 61 and that of the electroplating layer 62 are the same as in the first embodiment.

The back panel 51 is produced in the same manner as in the first embodiment. The back panel body 52 having the annular or contoured grooves 58, 59 being formed at predetermined sites is subjected to chemical plating. The plating solution hardly intrudes into the bottoms 58a, 59a of the grooves 58, 59, since they are narrow. Accordingly, the chemical plating layer 61 is formed on the entire surface of the back panel body 52 except for the bottoms 58a, 59a. The back panel body 52 having the chemical plating layer 61 formed thereon is then subjected to electroplating. In this process, like in the first embodiment, the protrusion 60 of the back panel body 52 serves as an electrode. The chemical plating layer 61 formed on the to-be-unplated portions (inner portion on the front surface) is dissolved by a predetermined solution. A multi-layered electroplating layer 62 is formed on the chemical plating layer 61 present on the portions where decorative plating is applied (the ridge of the frame of the back panel 51). Thus, the back panel body 52 having the chemical plating layer 61 and the electroplating layer 62 formed at the to-be-plated portions only can be obtained.

Subsequently, in the same manner as in the first embodiment, the portions on which the plating layer 53 is formed are covered with an electroforming mask (not shown). The portions which are not covered with the electroforming mask are coated with a coating material by means of spraying to form the coating layer 54 on the to-be-coated portions. After the coating layer 54 is formed, the electroforming mask is removed to obtain the back panel 51 having the plating layer 53 at the ridge of the frame and the coating layer 54 on the inner peripheral portion thereof. This embodiment also exhibits the same actions and effects as in the first embodiment.

Since the protrusion 60 serving as the electrode is formed on the rear surface of the back panel body 52 also in this embodiment, the protrusion does not impair the appearance of the resulting product. Further, the plating layer 53 formed on the rear surface of the back panel body 52 may be present only at the portion surrounded by the groove 64. Accordingly, the total amount of the plating solution can be reduced, leading to cost reduction.

Although two embodiments of the present invention have been described herein, it should be apparent to those skilled in the art that the present invention may be embodied in many other specific forms without departing from the spirit or scope of the invention. Particularly, it should be understood that the present invention may be embodied in the following manner:

The present invention may also be embodied in automotive parts such as an outer cover for door mirror bracket, a louver, a pillar garnish, a quarter vent and a mark plate other than the automotive front grille 1 and the back panel 51. The present invention is not limited to the resin products as described above, and it may be embodied in other resin products having plating layers and coating layers.

Resin materials other than ABS resins, such as polypropylene, polyphenylene oxide, polyamide, polysulfone and polyester, can be employed as the base material.

The chemical plating layers 15, 61 may be formed by metals other than copper or nickel. While the electroplating layers 16, 62 may be formed using other metals than the above three metals, i.e. copper, nickel and chromium, the plating layer may not have a multi-layered structure.

In the first and second embodiments, the electroplating step includes a plurality of steps including undercoat plating step to form electroplating layers 16, 62 as composite layers. However, the order of the steps in the electroplating step, the plating runs and the kind of plating may not particularly be limited.

In the first embodiment, hydrochloric acid and boric acid are added so as to adjust pH of the plating solution in the undercoat plating step to 4 or lower. However, these acids may be replaced with any other acids such as nitric acid, hydrofluoric acid and sulfuric acid. Further, the compositions of the respective plating solutions may not be limited to those described above.

In the first embodiment, the chemical plating layer 15 and the undercoat plating layer 16A are allowed to comprise copper and nickel, respectively, and only the chemical plating layer 15 is adapted to be dissolved in the chemical plating dissolving step by treatment with an aqueous alkaline solution. The chemical plating layer 15 and the undercoat plating layer 16A may contrariwise comprise nickel and copper, respectively, and an aqueous acidic solution may be employed in the chemical plating dissolving step. In the latter case, only the chemical plating layer 15 is dissolved. Such constitution can also exhibit the same actions and effects as in the first embodiment.

Both the chemical plating layer 15 and the undercoat plating layer 16A may comprise nickel, and the treatment may be carried out using a separate aqueous acidic solution. In this case, the thickness of the plating layer in which the undercoat plating layer 16 is additionally formed (to-be-plated portion) is greater than the plating layer formed on the to-be-unplated portion, so that the chemical plating layer 15 formed on the to-be-unplated portion dissolves first completely. Accordingly, this embodiment can also exhibit the same actions and effects as in the above embodiment. Further, both the chemical plating layer 15 and the undercoat plating layer 16A may comprise the same metal other than nickel (e.g. copper), and the to-be-plated portions and to-be-unplated portions may be dissolved by a predetermined solution.

Therefore, the present examples and embodiments are to be considered as illustrative and not restrictive, and the invention is not to be limited to the details given herein, but may be modified within the scope of the appended claims.

We claim:

1. A resin product partially having a decorative plating, comprising:
   a resin base material having a front surface and a rear surface, provided with to-be-plated portions and to-be-unplated portions on said front surface;
   boundaries formed by groves on said base material so as to demarcate said to-be-plated portions from said to-be-unplated portions, said boundaries defining contour lines;
   a decorative plating layer formed on said to-be-plated portions on said base material, said decorative plating layer having a chemical plating layer formed on said base material and an electroplating layer formed on said chemical plating layer;
   wherein said resin product contains an opening which permits communication between the front surface of the base material and the rear surface thereof for electrically coupling said front and rear surfaces when said electroplating layer is formed and also contains a protrusion which protrudes from the rear surface of the base material and serves as a part of electrode when said electroplating layer is formed.

2. The resin product according to claim 1, wherein said grooves have substantially V-shaped cross sections.

3. The resin product according to claim 1, wherein said communicating section has a front aperture and a rear aperture which open to the front Surface and the rear surface, the front aperture being smaller than the rear aperture.

4. The resin product according to claim 1, wherein the rear surface of said base material has a contoured boundary which surrounds said protrusion and is defined by grooves.

5. The resin product according to claim 1, wherein said resin product is an automotive exterior equipment.

6. The resin product according to claim 5, wherein said exterior equipment is a front grille.

7. The resin product according to claim 1, wherein said electroplating layer includes a composite plating layer containing a plurality of metals.

8. A partial plating process for applying to a resin product having a decorative plating layer including a chemical plating layer formed on to-be-plated portions on the surface of a resin base material having a front and rear surface and an electroplating layer formed on said chemical plating layer comprising:
   forming contoured boundaries defined by groves which set off said to-be-plated portions from the to-be-unplated portions, an opening, located within said boundary, which connects said front surface of said base material to said rear surface thereof and a protrusion on the rear surface of said base material;
   forming a chemical plating layer under nonelectrolytic conditions on the entire surface of said base material except for bottoms of said boundaries; and
   electroplating by electrically charging said to-be-plated portions of said chemical plating layer formed on said base material utilizing said protrusion as a part of an electrode under conditions which form an electroplating layer on said chemical plating layer.

9. The partial plating process for applying to a resin product having boundaries defined by grooves according to claim 8, wherein said grooves have substantially V-shaped cross sections.

10. The partial plating process for applying to a resin product according to claim 8, wherein the opening which permits communication between the front surface of the base material and the rear surface thereof has a front aperture and a rear aperture which open to the front surface and to the rear surface of the respective surface of the resin base material and the front aperture is smaller than the rear aperture.

11. The partial plating process for applying to a resin product according to Claim 8, further comprising forming a boundary defined by a groove on the rear surface of said base material which surrounds said protrusion.

12. The partial plating process for applying to a resin product according to claim 8, wherein said resin product is an automotive exterior equipment.

13. The partial plating process for applying to a resin product according to claim 12, wherein said exterior equipment is a front grille.

14. The partial plating process for applying to a resin product according to claim 8, wherein said electroplating involves immersing said base material having underwent said chemical plating step in plural kinds of plating solutions.

15. The partial plating process for applying to a resin product according to claim 14, wherein immersing said base material in a plurality of plating solutions involves:
1. ) electroplating by electrically charging the to-be-plated portions of said chemical plating layer formed on said base material under conditions to form an undercoat plating layer thereon and to allow said chemical plating layer to be exposed as such at the rest of the portions;
2. ) immersing said base material having underwent said first electroplating step in a solution so as to dissolve said exposed chemical plating layer; and
3. ) electroplating by electrically charging said undercoat plating layer under conditions to form an electroplating layer having a plurality of metal plating layers on said undercoat plating layer.

16. The partial plating process for applying to a resin product according to claim 15, wherein said undercoat plating layer is made of copper, and said solution is alkaline.

17. The partial plating process for applying to a resin product according to claim 15, wherein the plating solution employed in said plating step under nonelectrolytic conditions contains nickel ion, while the plating solution employed in said first electroplating step in said electroplating step has a pH of 4 or lower; said first electroplating step including a step of forming a first electroplating layer on said chemical plating layer present on the to-be-plated portions and simultaneously dissolving said chemical plating layer present on the to-be-unplated portions.

18. The partial plating process for applying to a resin product according to claim 17, wherein the plating solution for applying said first electroplating is an undercoat plating solution.

* * * * *